United States Patent
Lorenz et al.

(10) Patent No.: US 8,062,931 B2
(45) Date of Patent: Nov. 22, 2011

(54) SURFACE TREATMENT AND PASSIVATION OF ALGAN/GAN HEMT

(75) Inventors: Anne Lorenz, Leuven (BE); Joff Derluyn, Brussels (BE); Joachim John, Freiburg (DE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 146 days.

(21) Appl. No.: 12/447,867

(22) PCT Filed: Nov. 20, 2007

(86) PCT No.: PCT/EP2007/010181
§ 371 (c)(1),
(2), (4) Date: May 6, 2009

(87) PCT Pub. No.: WO2008/061778
PCT Pub. Date: May 29, 2008

(65) Prior Publication Data
US 2010/0090251 A1   Apr. 15, 2010

Related U.S. Application Data

(60) Provisional application No. 60/860,433, filed on Nov. 21, 2006.

(51) Int. Cl.
*H01L 21/00* (2006.01)

(52) U.S. Cl. .......... 438/115; 438/465; 438/38; 438/958; 257/626; 257/E23.132

(58) Field of Classification Search .................. 438/172, 438/115; 257/626
See application file for complete search history.

(56) References Cited

U.S. PATENT DOCUMENTS

| 2006/0006414 A1* | 1/2006 | Germain et al. ............. 257/192 |
| 2006/0226442 A1* | 10/2006 | Zhang et al. ................. 257/192 |

FOREIGN PATENT DOCUMENTS

| EP | 1 612 866 A | | 1/2006 |
| JP | 2002057158 A | * | 2/2002 |
| WO | WO 2005/076365 A | | 8/2005 |
| WO | WO 2006/012293 A | | 2/2006 |

OTHER PUBLICATIONS

Germain et al. "Surface Stabilization for Higher Performance AlGaN/GaN HEMT With In-Situ MOVPE SiN", Materials Research Society Symposium, vol. 831, 2005, pp. 361-366.

(Continued)

*Primary Examiner* — Ajay K Arora
(74) *Attorney, Agent, or Firm* — Knobbe Martens Olson & Bear LLP

(57) ABSTRACT

In the preferred embodiments, a method to reduce gate leakage and dispersion of group III-nitride field effect devices covered with a thin in-situ SiN layer is provided. This can be obtained by introducing a second passivation layer on top of the in-situ SiN-layer, in combination with cleaning of the in-situ SiN before gate deposition and before deposition of the second passivation layer.

25 Claims, 10 Drawing Sheets

OTHER PUBLICATIONS

Hashizume et al. "Leakage mechanism in GaN and AlGaN Schottky interfaces", Appl. Phys. Lett., vol. 84, No. 24, 2004, pp. 4884-4886.

Kim et al. "Gate current leakage and breakdown mechanism in unpassivated AlGaN/GaN high electron mobility transistors by post-gate annealing" Appl. Phys. Lett. vol. 86, 2005, pp. 143505-1-3.

Meneghesso et. al "Surface-Related Drain Current Dispersion Effects in AlGaN-GaN HEMETs" IEEE Transactions on Electron Devices, vol. 51, No. 10, 2004, pp. 1554-1561.

Raider et al. "Surface Oxidation of Silicon Nitride Films", J. Electrochem. Soc.: Solid State Science and Technology, vol. 123, No. 4, 1976, pp. 560-565.

Williams et al. "Etch Rates for Micromachining Processing", Journal of Microelectromechanical Systems, vol. 5, No. 4, Dec. 1996, p. 262.

Xing et al. "High Breakdown Voltage AlGaN-GaN HEMETs Achieved by Multiple Field Plates" IEEE Electron Device Letters, vol. 25, No. 4, 2004, pp. 161-163.

\* cited by examiner (a)

(b)

(c)

(a)

SURFACE TREATMENT AND PASSIVATION OF ALGAN/GAN HEMT

CROSS-REFERENCE TO RELATED APPLICATIONS

This application is the national phase under 35 U.S.C. §371 of prior PCT International Application No. PCT/EP2007/010181 which has an International Filing Date of Nov. 20, 2007, which designates the United States of America, and which claims priority under 35 U.S.C. §119(e) to U.S. Provisional Application No. 60/860,433 filed Nov. 21, 2006, the disclosures of which are hereby expressly incorporated by reference in their entirety and are hereby expressly made a portion of this application.

TECHNICAL FIELD OF THE INVENTION

The preferred embodiments are related to group III-nitride field effect devices (e.g. comprising a GaN/AlGaN layer) such as transistors and methods to produce such devices.

BACKGROUND OF THE INVENTION

AlGaN/GaN transistors find their applications in high frequency, high power electronics. Due to their intrinsic properties, i.e. high mobility and high breakdown field, they are suited to serve as amplifiers and switches in telecom and power devices, respectively.

The dispersion, i.e. degradation of the output current under large signal operation at high frequency, is an important problem in AlGaN/GaN transistors. G. Meneghesso, et. al (in IEEE Transactions on Electron Devices, Vol. 51, No. 10, October 2004) report surface states as a cause of the dispersion effect. To avoid or minimize the effect of dispersion, Huili Xing et al. (in IEEE Electron Device Letters, Vol. 25, No. 4, April 2004) installed a field plate on top of the gate.

Another problem is the reverse leakage current of the gate Schottky contact (see Hashizume, T. et al. in Appl. Phys. Lett., vol. 84, pp. 4884-4886, 2004). Hyeongnam Kim et al. (in Appl. Phys. Lett. vol. 86, pp 143505, 2005) showed that a high leakage current leads to losses in the transistor and will influence the reliability.

In EP1612866 a method for manufacturing a group III-nitride field effect device is presented by covering the surface with a thin SiN layer in the same reactor prior to cooling down the structure. Also the corresponding device is presented.

Oxidation of $Si_3N_4$ has been reported by Raider, S. I. in J. Electrochem. Soc.: Solid State Science and Technology, April 1976. These oxide states can provide carriers and perform a surface leakage path.

SUMMARY

Embodiments of the present invention provide a method to manufacture a group III-nitride field effect device covered with a thin SiN layer with reduced dispersion and reverse leakage current of the gate contact.

Deposition of the different layers is done on a substrate that is placed in a reaction chamber. Prior to the deposition of the active layers, nucleation layers can be deposited. Subsequently a first active layer is deposited and on top a second active layer with a higher bandgap when compared to the first active layer is deposited. That way a two-dimensional electron gas layer is created at or near the interface between the first active layer and the second active layer. Also other functional layers can be deposited. A first passivation layer is then deposited. On the first passivation layer, source contact and drain contacts are deposited. On at least a first part of the first passivation layer (called "gate cleaning region") a first cleaning step is done. Subsequently the gate contact is fabricated on the gate cleaning region or on a part of the gate cleaning region. On top a second passivation layer is deposited.

In another embodiment, a second cleaning step on the first passivation layer or on a part of the first passivation layer (called "passivation cleaning region") is done. The second passivation layer is deposited on at least part of the passivation cleaning region.

In another embodiment, a 2 DEG layer is present at or near the interface between the first and the second active layer underneath the gate contact.

In an embodiment, the first cleaning step and the fabrication of the gate contact are done before the deposition of the second passivation and, if present, the second cleaning step.

In an embodiment, the deposition of the second passivation and, if present, the second cleaning step are done before the first cleaning step and the fabrication of the gate contact. In that case a hole is etched through the second passivation layer down to the gate cleaning region.

In another embodiment, the first cleaning step is etching partially in the first passivation layer. If a second cleaning step is done, in another embodiment the second cleaning step is etching partially in the first passivation layer. In still another embodiment, when both first and second cleaning steps are done, both first and second cleaning steps are etching partially in the first passivation layer. In fact the cleaning steps become removal steps or etching steps, etching partially in the first passivation layer.

In an embodiment the etching or removal step etches maximum 1 nm of in the first passivation layer.

In an embodiment, the first passivation layer comprises at least an electron donating element and nitrogen. In an embodiment, the first passivation layer is silicon nitride deposited in-situ with Metal Organic Chemical Vapor Deposition (MOCVD).

In another embodiment, the first cleaning step is done in a solution comprising buffered HF. If the second cleaning step is done, in another embodiment, the second cleaning step is done in a solution comprising buffered HF. In still another embodiment, when both first and second cleaning steps are done, both first and second cleaning steps are done in a solution comprising buffered HF.

In another embodiment, the first cleaning step is done by dry etching with gases comprising any of $SF_6$, $CF_4$, $C_4F_8$, $N_2$, Ar or a combination of any of these. If the second cleaning step is done, in another embodiment, the second cleaning step is done by dry etching with gases comprising any of $SF_6$, $CF_4$, $C_4F_8$, $N_2$, Ar or a combination of any of these. In still another embodiment, when both first and second cleaning steps are done, both first and second cleaning steps are done by dry etching with gases comprising any of $SF_6$, $CF_4$, $C_4F_8$, $N_2$, Ar or a combination of any of these.

In another embodiment, the first cleaning step is a combination of cleaning in a solution comprising buffered HF and dry etching with gases comprising any of $SF_6$, $CF_4$, $C_4F_8$, $N_2$, Ar or a combination of any of these. If the second cleaning step is done, in another embodiment, the second cleaning step is a combination of cleaning in a solution comprising buffered HF and dry etching with gases comprising any of $SF_6$, $CF_4$, $C_4F_8$, $N_2$, Ar or a combination of any of these. In still another embodiment, when both first and second cleaning steps are done, both first and second cleaning steps are a combination of cleaning in a solution comprising buffered HF and dry etching with gases comprising any of $SF_6$, $CF_4$, $C_4F_8$, $N_2$, Ar or a combination of any of these.

In another embodiment, the second passivation layer comprises a material or materials selected from the group consisting of SiO, SiN, AlO, HfO, and TaO.

In another embodiment, the second passivation layer is any of: sputtered SiO or SiO or SiN deposited with Plasma Enhanced Chemical Vapor Deposition (PECVD).

In another embodiment, the first and second active layers comprise group III nitride semiconductor materials. In another embodiment, the first active layer comprises GaN and the second active layer comprises AlGaN or AlGaInN.

Figure 1:
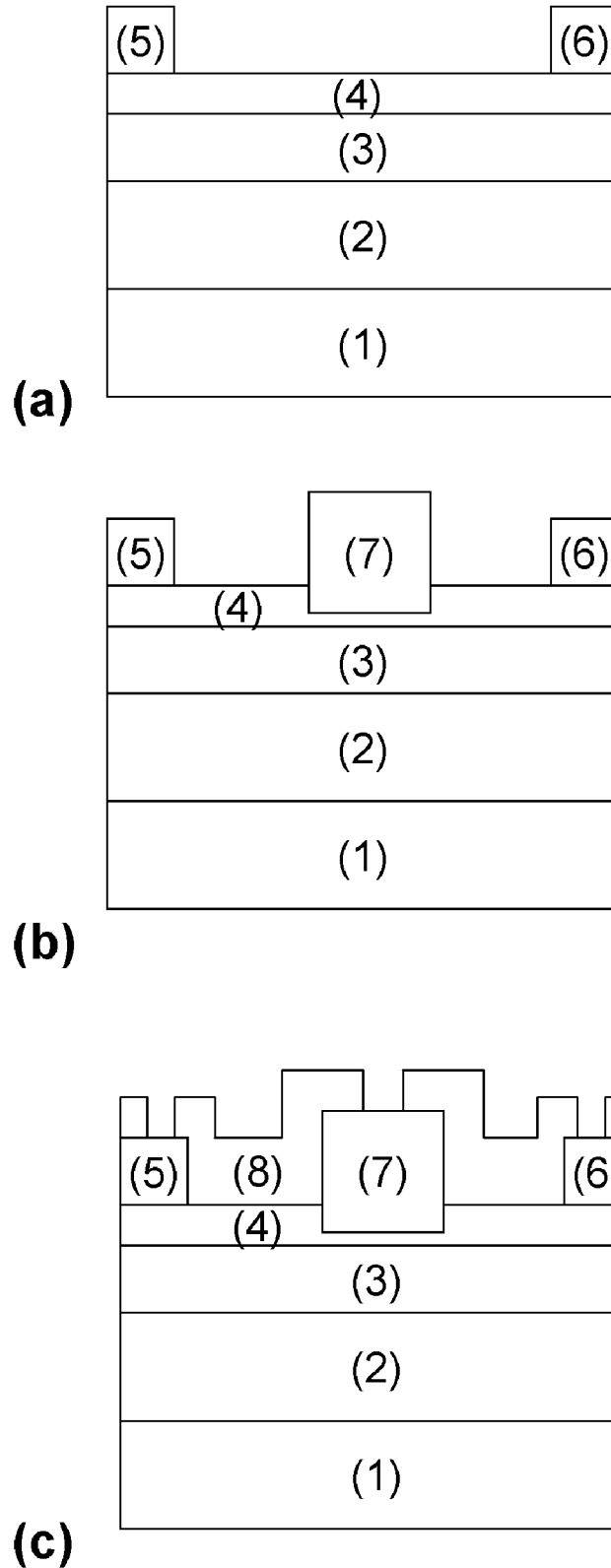
FIG. 1: Schematic representation of the fabrication of a group III-nitride field effect device whereby the gate (7) is fabricated prior to depositing the second passivation layer (8).

Table 1: XPS Measurement results.

DETAILED DESCRIPTION

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used herein are to be understood as being modified in all instances by the term "about." Accordingly, unless indicated to the contrary, the numerical parameters set forth herein are approximations that may vary depending upon the desired properties sought to be obtained. At the very least, each numerical parameter should be construed in light of the number of significant digits and ordinary rounding approaches.

When in the following materials or layers are mentioned without indication of the exact composition, for example SiN (also called silicon nitride or nitride) or SiO (also called silicon oxide), both the non-stoichiometric composition ($Si_xN_y$ or $Si_xO_y$) and the stoichiometric composition ($Si_3N_4$ or $SiO_2$) are included. The layers can also be a combination of regions with non-stoichiometric composition ($Si_xN_y$ or $Si_xO_y$) and regions with stoichiometric composition ($Si_3N_4$ or $SiO_2$)

The present invention proposes a method to fabricate group III-nitride field effect devices with improved characteristics. High Electron Mobility Transistors (HEMT's) are the best known example of group III-nitride field effect devices. The operation of group III-nitride field effect devices is based on the creation of a two-dimensional electron gas (2 DEG) at or near the interface between the two active layers. An active layer in group III-nitride field effect devices is a layer that contributes to the formation of the 2 DEG. This can be for example because the layer is spontaneously or piezo-electrically polarised, or alternatively because the whole layer or part of the layer is highly doped and the free electrons diffuse into the 2 DEG layer. The 2 DEG layer, i.e. the channel of the transistor is located in an active layer or at the interface between two active layers. An active layer is intrinsic to the transistor effect. The active layers will be called first (2) and second (3) active layer (see FIGS. 1 and 2) in the following.

In general, the second active layer (3) has a higher bandgap when compared to the first active layer. Depending on the thickness, the composition and the loading effects on the surface of the second active layer (3), a two-dimensional electron gas (2 DEG) may appear at or near the interface between the two active layers. The thickness, the composition and the loading effects on the surface of the second active layer (3) can be chosen such that substantially a 2 DEG is created at or near the interface between the two active layers. An example of active layers is a combination of GaN/AlGaN.

On top of the active layers one (4) or more passivation layers (4,5), for example SiN or SiO (non-stoichiometric $Si_xN_y$ or $Si_xO_y$ or stoichiometric $Si_3N_4$ or $SiO_2$ or a combination of those layers) can be deposited. In silicon CMOS processing a passivation layer is used to avoid shift in $V_t$, such that a better reliability can be obtained. In case of group III-nitride field effect devices, the passivation layer is used to avoid trapping and detrapping of charges in surface states, i.e. to avoid changes in the 2 DEG density. So, the passivation layer protects the transistor from external modifications, such that the transistor characteristics are affected as little as possible by extrinsic parameters, such as modifications of electrical charges on the surface. A passivation layer fixes or freezes the existing state of the surface of underlying (active) layers. Consequently the surface of the underlying (active) layers is less sensitive to changes in the environment and the effect of the state of the surface of the underlying (active) layers on the properties of the underlying layer is less sensitive to changes in the environment.

Gate leakage current and dispersion are known problems of group III-nitride field effect devices. Surface states at the interfaces of the layers, especially at the top surface of the second active layer (for example AlGaN), and charges inside the dielectrics influence the dispersion. Surface states are influenced by the choice of materials, the deposition parameters of different layers, cleaning steps and surface treatments at different stages of the process flow. These treatments also have an influence on the reverse leakage current of the gate contact.

To optimise the operation of group III-nitride field effect devices, much effort is done to optimise the interface between the second active layer (3) and the passivation (4), for example AlGaN—SiN interface, as it is believed that charges at this interface play a dominant role.

In the present invention, the preferred embodiments are directed to a method to reduce gate leakage current and dispersion of group III-nitride field effect devices covered with a first passivation layer (4). The method can be used on any first passivation layer, protecting the group III-nitride field effect devices whereby the first passivation layer still has an influence on the 2 DEG layer or when the first passivation layer degrades over time for example due to oxidation and/or contamination. Degradation may occur due to accumulation in time of oxide and/or contaminants on the surface of the passivation layer in time, for example when storing the devices in air. This accumulation changes the 2 DEG layer such that the operation of the device is changing in time. The method can be used for group III-nitride field effect devices covered with a SiN layer, or a thin SiN layer, or a thin in-situ SiN layer. In fact the method reduces trapping effects and allows reducing dynamic effects in group III-nitride field effect devices. An example are GaN/AlGaN field effect transistors, covered with a thin in-situ SiN layer.

The method is based on cleaning steps on the first passivation layer, for example a thin in-situ SiN layer (non-stoichiometric $Si_xN_y$ or stoichiometric $Si_3N_4$). Cleaning steps on an extra second passivation layer, for example an SiO layer (non-stoichiometric $Si_xO_y$ or stoichiometric $SiO_2$) on the SiN may follow. The method has beneficial effect on the gate leakage current and dispersion.

Figure 2:
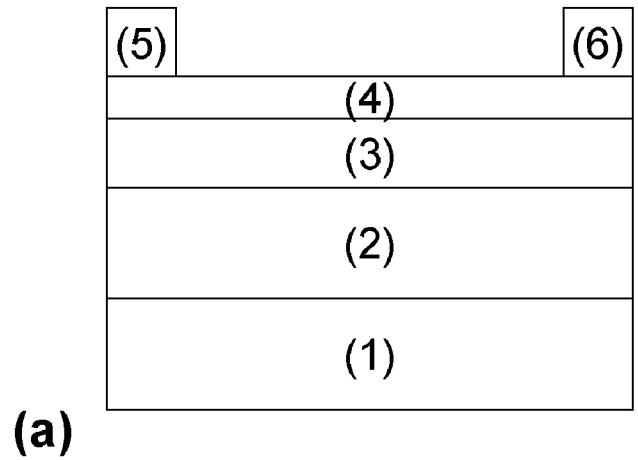
FIG. 2: Schematic representation of the fabrication of a group III-nitride field effect device whereby the second passivation layer (8) is deposited prior to the fabrication of the gate (7).
Figure 2:
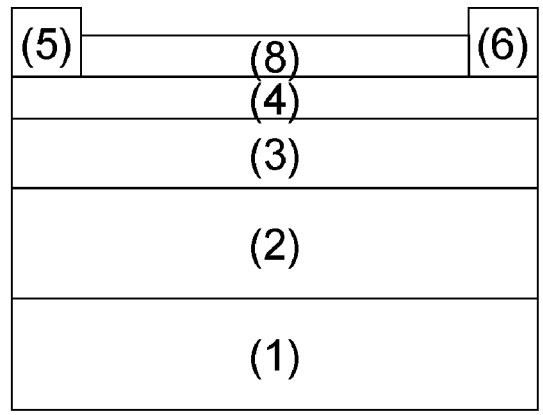
Figure 2:
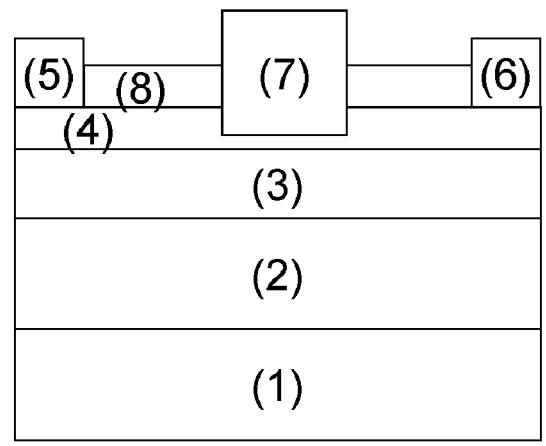

FIGS. 1 and 2 represent two different fabrication routes for group III-nitride field effect devices, but these are exemplary only and the invention is not limited thereto. These devices can be made as follows. The group III-nitride field effect devices can be deposited on a substrate (1). The substrate can be sapphire, SiC, Si or any other material that can be used as a substrate for the deposition of group III-nitrides and the fabrication of group III-nitride devices. Suitable substrates are also selectable from GaN, AlN, GaAs, Ge or diamond. Also substrates comprising one or more of these materials can be used, such as silicon on insulator or GaN on diamond. On the substrate a first (2) and second (3) active layer can be deposited. Before the deposition of the first active layer a nucleation layer can be deposited. Also other functional layers can be added. An example of active layers is a combination of GaN/AlGaN. Before the deposition of the GaN often a GaN nucleation layer is deposited. Also other functional layers can be added. The different layers can be grown by MOVPE or other methods known in the field.

Subsequently the stack is covered by a first passivation layer. Preferably this passivation layer comprises at least an electron donating element and nitrogen, for example is a SiN passivation layer or a thin in-situ SiN passivation layer (4). The SiN can be non-stoichiometric SiN or stoichiometric $Si_3N_4$ or a combination of both stoichiometric $Si_3N_4$ and non-stoichiometric $Si_xN_y$. In the best case this SiN is stoichiometric $Si_3N_4$. The thickness of the passivation layer, for example SiN, can vary between 1 nm and 5000 nm, even better between 2 nm and 10 nm, even better between 3 nm and 5 nm. This can be done by MOCVD according to EP1612866 or by any other method known in the field.

The SiN layer can be deposited with Metal Organic Chemical Vapor Deposition (MOCVD), for example. Preferably the SiN has a high quality, meaning a limited number of defects. Preferably, the SiN is deposited in-situ, and in the best case before cooling down the device. With 'in situ' is meant that the passivation layer is applied in the same deposition tool, in the best case before cooling down the device, for example by depositing the passivation layer in the same reaction chamber as the deposition of the first and second active layer.

In this structure, a mesa structure can be etched to isolate the single devices down to the GaN. A mesa structure is created by etching trenches between devices, thereby isolating active regions of individual devices. Mesa etching can also be done later in the processing, for examples after the formation of source, drain, and gate contacts. The complete GaN/AlGaN/SiN stack can be patterned or patterning can be done layer-by-layer. The layers can be patterned by standard lithography and micro-structuring techniques, as wet chemical etching, dry etching. The etching step can be performed in a reactive ion etch (RIE) system using chlorine chemistry.

Metallization of the Ohmic source (5) and drain (6) contacts with a subsequent high temperature annealing is done on top of the SiN passivation layer. Metallisation can be done by Ti/Al/Mo/Au stack or other materials known in the field. The metallization is performed on top of the in-situ SiN overlapping the etched MESA structure.

Afterwards a gate can be made and additional cleaning steps and extra passivation layers can be deposited.

FIGS. 1 and 2 represent two different ways to proceed with these steps, but other ways are included within the scope of the present invention. In one embodiment (see FIG. 1), the gate contact can be made after the deposition the SiN layer, source and drain, but before the deposition of the second passivation layer. In another embodiment (see FIG. 2) the gate contact can be made after the deposition of the second passivation layer.

As the second active layer (3) has a higher band-gap when compared to the first active layer (2), a two-dimensional electron gas (2 DEG) may appear at or near the interface between the two active layers. A 2 DEG layer may or may not be is present underneath the gate, but preferably a 2 DEG layer is present underneath the gate.

In an embodiment (see FIG. 1), the gate contact (7) can be made after the deposition and patterning of the first passivation layer (4), for example SiN layer, source (5) and drain (6), but before the deposition of the second passivation layer (8). So after fabricating the first passivation layer (4), source (5) and drain (6) (FIG. 1(a)), the gate contact can be made (FIG. 1(b)). The gate (7) can be deposited directly on the SiN layer.

The gate contact can be made by lift-off technique, for example. This can be done as follows. Holes can be defined in a resist layer on the first passivation layer, for example SiN, at locations where the gate contacts will be formed. Subsequently, cleaning of the underlying material of the first passivation layer, for example SiN, at these locations can be done. The cleaning step can remove or etch some material, for example SiN, at these locations. That way holes can be created or etched in the first passivation layer, for example SiN layer, by the cleaning step at the locations where the gate contact will be made. Preferably, only short etching or cleaning is done in these holes in the resist layer without further etching the underlying first passivation layer or etching only a very thin layer of the first passivation layer. The depth of the holes can be only 1 nm or less. Etching of the holes can also be done down to the underlying material, such that there is no remaining passivation, for example SiN, in the holes. However, in a preferred embodiment, a certain depth of the passivation layer, e.g. at least 1 nm of the first passivation layer, for example SiN, remains in the hole. Subsequently the gate metal can be deposited and the gate can be defined by a metal lift-off process.

Alternatively, the gate metal can be patterned by dry etching or wet chemical etching techniques or a combination of both. In that case cleaning of the SiN is done before deposition of the gate metal. This can be done by cleaning of the full SiN layer. Alternatively only part of the SiN can be cleaned on which the gate will be formed. Subsequently the gate is defined by lithography and dry and/or wet etching.

The gate can be for example any suitable conductive layer such as a metal layer such as Ni/Au or Mo/Au or any other material or combination of materials used in the art, and can for example be deposited by means of sputter deposition.

Subsequently a second passivation layer (8) can be deposited on the SiN layer (FIG. 1(c)). This can be used to protect the underlying layers, for example from oxidation. This second passivation layer can be SiO (silicon oxide), SiN (silicon nitride), AlO (aluminium oxide), HfO (hafnium oxide), or TaO (tantalum oxide) or can contain any of SiO, SiN, AlO, HfO, or TaO, or can be a combination of several layers containing any of SiO, SiN, AlO, HfO, or TaO. In fact any other material that can be used as a passivation layer can be included in this second passivation layer. Preferably, sputtered SiO is used or SiO or SiN deposited with Plasma Enhanced Chemical Vapor Deposition (PECVD) is used. The thickness of this second passivation layer can be in between 1000 nm and 5 nm, in between 10 nm and 5000 nm, between 100 nm and 400 nm, or between 150 nm and 250 nm.

This second passivation layer can cover the whole structure. In that case holes can be provided for contacting source, drain and gate. Etching of these holes can be done with standard lithography and etching or other methods know in the art. This may be a final passivation layer or other layers can be added.

In another embodiment, the second passivation layer is located on the region of the SiN that is not covered by source, drain or gate. In fact the second passivation layer is only covering the uncovered part of the SiN layer or the part of the SiN layer that is still exposed to air. In that case no extra holes for contacting source, drain and gate are needed.

Prior to the deposition of this second passivation layer, a second cleaning step can be done. This can also be a removal step. Preferably this removal step etches only a very thin layer of the first passivation layer. The deposition of the second passivation layer immediately after cleaning the first passivation layer, for example SiN, prevents re-oxidation of the first passivation layer, for example in-situ SiN, and prevents the adsorption of other contaminants on the first passivation layer, for example SiN-surface.

In another embodiment (see FIG. 2) the gate contact (7) can be made after the deposition of the second passivation layer (8) (FIG. 2(b)). Different materials and thickness of the second passivation layer are given above, for the processing related to FIG. 1. Prior to the deposition of this second passivation layer (8) cleaning of the first passivation layer (second cleaning step), for example SiN, can be done. The deposition of the second passivation layer immediately after cleaning the first passivation layer, for example SiN or in-situ SiN, prevents re-oxidation of the first passivation layer, for example SiN or in-situ SiN, and prevents the adsorption of other contaminants on the first passivation layer, for example SiN or in-situ SiN-surface.

At the location where the gate (7) will be formed, a hole can be etched in the second passivation layer at least down to the underlying first passivation layer, for example SiN. The hole may be etched into the underlying first passivation layer, for example SiN layer, preferably with still some of the first passivation, for example SiN, remaining in the hole. Etching this hole can be done by lithography and dry and/or wet etching.

Subsequently, the gate (7) can be formed (FIG. 2(c)). Before deposition of the gate, the underlying material, for example SiN can be cleaned. This first cleaning step can remove some material. Preferably still some material of the first passivation layer remains at the cleaning area.

The gate contact can be made by lift-off. After defining holes in the resist, at locations where the gate contacts will be formed, cleaning or etching of the material in the holes can be done. Thereby some material can be removed where there are holes in the resist layer. Preferably, at least some of the first passivation layer, e.g. at least 1 nm of the first passivation layer, for example SiN, remains in the hole. Subsequently, the gate metal can be deposited and the gate can be defined by a metal lift-off process.

Alternatively, the gate metal can be patterned by dry etching or wet chemical etching techniques or a combination of both. In that case cleaning of the underlying material is done before deposition of the gate metal. Subsequently the gate is defined by lithography and dry and/or wet etching.

The description below related to the cleaning steps can be applied to both embodiments illustrated in FIGS. 1 and 2, as well as in other possible embodiments.

A first cleaning step of the SiN before deposition of the gate metal and a second cleaning step on the SiN before deposition of the second passivation layer can have a beneficial effect on gate leakage current and dispersion. In fact these cleaning steps can remove some material, for example contaminants, and/or oxide and/or some part of the SiN layer. In fact the cleaning step can be a removal step. Therefore, these cleaning steps can be defined as removal steps. These removal steps can be surface cleaning steps. So the first cleaning step can be a first removal step and the second cleaning step can be a second removal step.

Surface cleaning of the in-situ SiN can be done both before deposition of the gate metal and before depositing the second passivation layer. Surface cleaning of the in-situ SiN can be done only before deposition of the gate metal without surface cleaning before depositing the second passivation layer. Surface cleaning of the in-situ SiN can be done only before deposition of the second passivation layer without surface cleaning before deposition of the gate metal. All can have a positive influence on dispersion and gate leakage current. Surface states at the interfaces of the layers and charges inside the dielectrics influence the dispersion and can have an influence on the reverse leakage current of the gate contact. These surface states can be influenced by cleaning and surface treatments. Annihilation of the surface states can be obtained.

The area or surface on the first passivation layer where the first cleaning step is done can be called the "gate cleaning region". The gate is deposited on at least part of this "gate cleaning region". In the best case, the part of the surface of the first passivation layer on which the gate will be formed is fully cleaned. So cleaning is done at least underneath the gate. This means that the gate contact is fully included within the "gate cleaning region".

The first cleaning step can be done locally, for example only at the locations where the gate contact will be made. So the "gate cleaning region" is part of the surface of the first passivation layer. The first cleaning step can also be done on a larger area, so the "gate cleaning region" is larger than the surface on which the gate will be formed. The gate contact can than be made within this "gate cleaning region". The gate can only partially overlap the "gate cleaning region". The first cleaning step can also be done on the full uncovered part of the first passivation layer. In that case the full uncovered surface of the first passivation layer is the "gate cleaning region".

The area on the first passivation layer where the second cleaning step is done can be called the "passivation cleaning region". The second passivation is deposited on at least part of this "passivation cleaning region". In the best case, part of the surface of the first passivation layer on which the second passivation will be formed is fully cleaned. So cleaning is done at least underneath the second passivation. This means that the second passivation is fully included within the "passivation cleaning region".

The second cleaning step can be done locally, for example only at the locations where the second passivation will be made. So the "passivation cleaning region" is part of the surface of the first passivation layer. The second cleaning step can also be done on a larger area, so the "passivation cleaning region" is larger than the surface on which the second passivation will be formed. In that case the second passivation can be made within this "passivation cleaning region". The second passivation can only partially overlap the "passivation cleaning region". Preferably, the second cleaning step is done at least on the part of the surface of the first passivation layer not covered by other materials. Preferably the second passivation layer fully covers at least the part of the first passivation layer that is uncovered and cleaned with the second cleaning step. The second cleaning step can be done on the full first passivation layer. In that case the full surface of the first passivation layer is the "passivation cleaning region".

For cleaning any chemical solution can be used that removes SiO and/or contaminants thereby not removing or only removing a limited amount of the first passivation layer. Preferably nothing or only a thin layer of the first passivation layer is removed. In the best case a few nm (for example 1, 2, or 5 nm) of the first passivation layer are remaining on the device. In case of SiN any chemical solution that removes SiO and/or contaminants at an etch rate $\geq 10$ when compared to the etch rate of SiN can be used. Cleaning of SiN can for example be done with a buffered HF (BHF) solution. BHF is defined as 6 parts 40% $NH_4F$ and 1 part 49% HF. The etch time can vary from about 5 sec to about 3 min., preferably from about 30 sec to about 2 min, even more preferably about 1 min. Cleaning of SiN can also be done with diluted HF. Also vapor HF can be used, as well as any vapor having an etch rate of SiO more than 10 times larger than the etch rate of SiN.

The first passivation layer can also be cleaned by dry etching. Thereby only a thin layer of the first passivation layer can be removed. In the best case a few nm (for example 1, 2, or 5 nm) of the first passivation layer are remaining on the device. SiN can be cleaned by a dry etching cleaning step comprising $SF_6$, $CF_4$, $C_4F_8$, $N_2$, Ar, $NH_3$ or a combination of any. In case of $N_2$-plasma the etch time can vary from about 1 sec to about 300 sec, even more preferably about 10 sec.

Also a combination of dry and wet etching can be used to clean the first passivation layer, for example SiN. First and second cleaning steps can be wet or dry etch, or a combination of wet and dry cleaning.

The first and second cleaning steps can be different thereby using any combination of wet and/or dry cleaning. For example, the first cleaning step can be a wet cleaning step and the second cleaning step can be dry cleaning step. Inversely the first cleaning step can be a dry cleaning step and the second can be a wet cleaning step. The first cleaning step can be wet or dry and the second cleaning step can be a combination of dry and wet cleaning. Alternatively, the first cleaning step can be a combination of dry and wet cleaning and the second cleaning step can be wet or dry.

The cleaning step can only remove contaminants on the surface. The cleaning step can also remove oxide or reduce the amount of oxide absorbed on the surface. In fact any method for removing material or oxide from the first passivation layer, for example SiN surface can be used. When removing material or oxide from the surface also contaminants can be removed.

The time that can pass between the cleaning step and the deposition step (both for the gate and the second passivation) depends on the atmosphere in which the sample is stored. If the sample is transferred into a vacuum chamber immediately after the cleaning step, the time until the deposition takes place can be up to days. When the sample is stored in a non-oxidizing atmosphere, for example nitrogen, the time between cleaning and deposition can also be up to days. In other atmospheres, the time between this first cleaning step and the transfer to the deposition system/chamber is preferably less than about 5 min, more preferably less than about 3 min, even more preferably less than about 1 min, more preferably still from about 5 sec to about 5 min, preferably from about 5 sec to about 3 min, preferably from about 5 sec to about 1 min. In the best case, the gate and/or second passivation layer are deposited in the same atmosphere, in-situ, or maximum a few minutes after the cleaning step.

Example 1

Test structures were prepared as follows (see FIG. 1). On top of a 2 inch sapphire substrate (1), a GaN nucleation layer was deposited, followed by a GaN buffer layer of 1 μm (2) and an $Al_{0.3}Ga_{0.7}N$ layer of 20 nm thickness (3). The layer stack was covered by in-situ $Si_3N_4$ passivation layer of 3 nm (4). The different layers were grown by MOVPE. A mesa structure was etched to isolate the single devices down to the GaN. The complete GaN/AlGaN/$Si_3N_4$ stack was etched. The etching step was performed in a ICP-RIE (inductively coupled plasma-reactive ion) system using chlorine chemistry.

Subsequently, metallization Ti/Al/Mo/Au of the Ohmic source (5) and drain (6) contacts with a subsequent high temperature annealing were done. The metallization was performed on top of the in-situ $Si_3N_4$ overlapping the etched MESA structure. Subsequently resist was deposited and holes were defined in the resist layer at the locations of the gate contacts (7). In the holes maximum 1 nm $Si_3N_4$ was removed by a wet cleaning step. This wet cleaning step was performed during 2 min. On blanket $Si_3N_4$ layers 3.5 nm $Si_3N_4$ was removed in 12 min, giving an etch rate of about 0.3 nm/min on blanket $Si_3N_4$ layers. From this it can be concluded that less than 1 nm $Si_3N_4$ was removed, even better maximum 0.6 nm $Si_3N_4$ was removed during wet cleaning. Consequently there was still some remaining $Si_3N_4$ in the holes. The gate (7) was defined by a metal lift-off process using Ni/Au, deposited by means of sputter deposition. After forming the source, drain and gate, another second passivation layer (8) was added to protect the underlying layers, in which contacting regions to the source, drain and gate were made. For the second passivation layer (8) sputtered $SiO_2$ with a thickness of 200 nm was used.

Cleaning steps were included. Cleaning was done with a buffered HF (BHF) solution, followed by a water rinse. BHF is defined as 6 parts 40% $NH_4F$ and 1 part 49% HF. A first cleaning step was included immediately prior to the deposition of the gate metal, after the lithography step. A second cleaning step was introduced prior to the deposition of the second or final passivation dielectrics. The influence of the cleaning steps on gate leakage current and dispersion was investigated.

Figure 3:
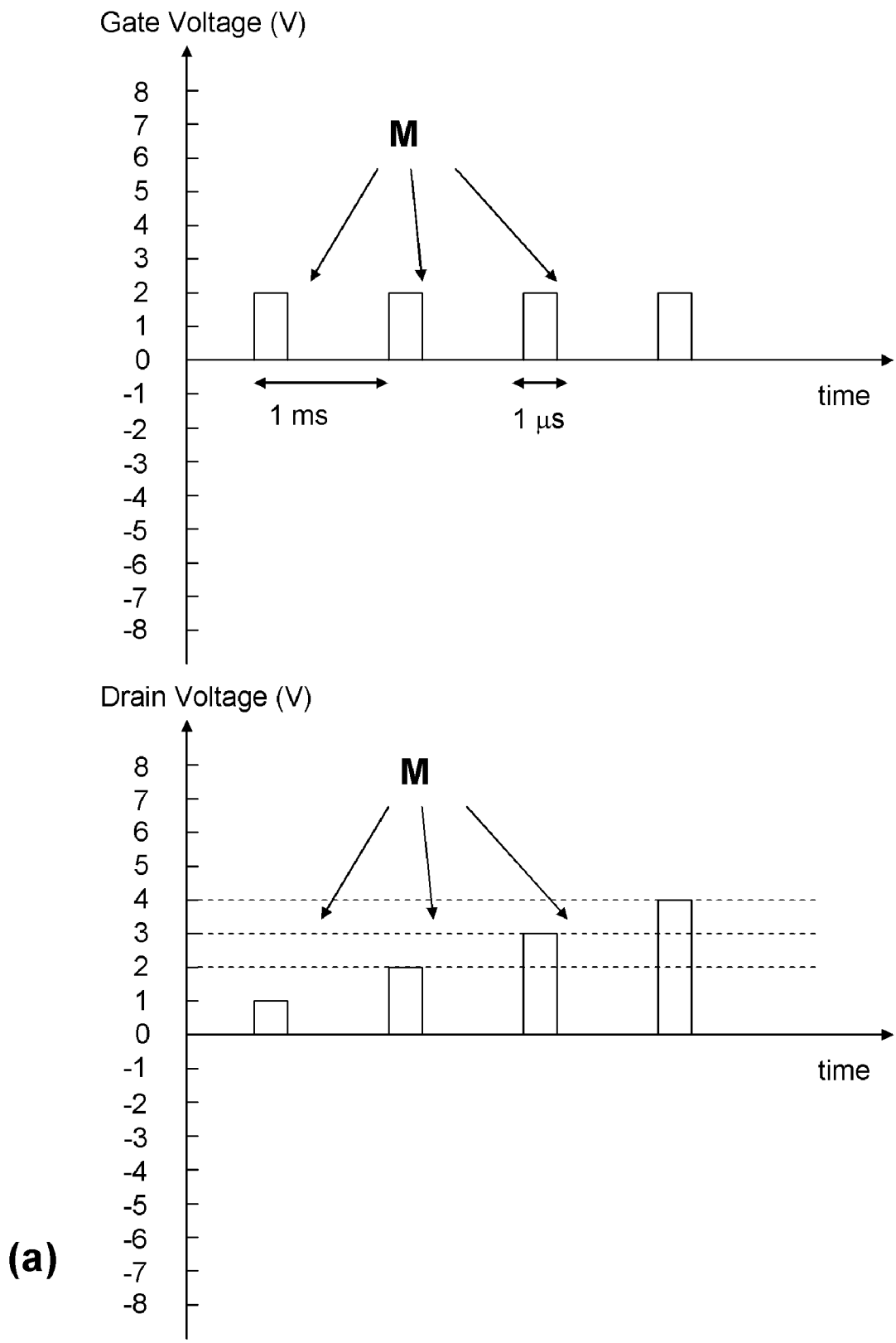
FIG. 3: Schematic description of the pulse measurements: (a) reference, (b) gate lag measurement, and (c) drain lag measurement.
Figure 3:
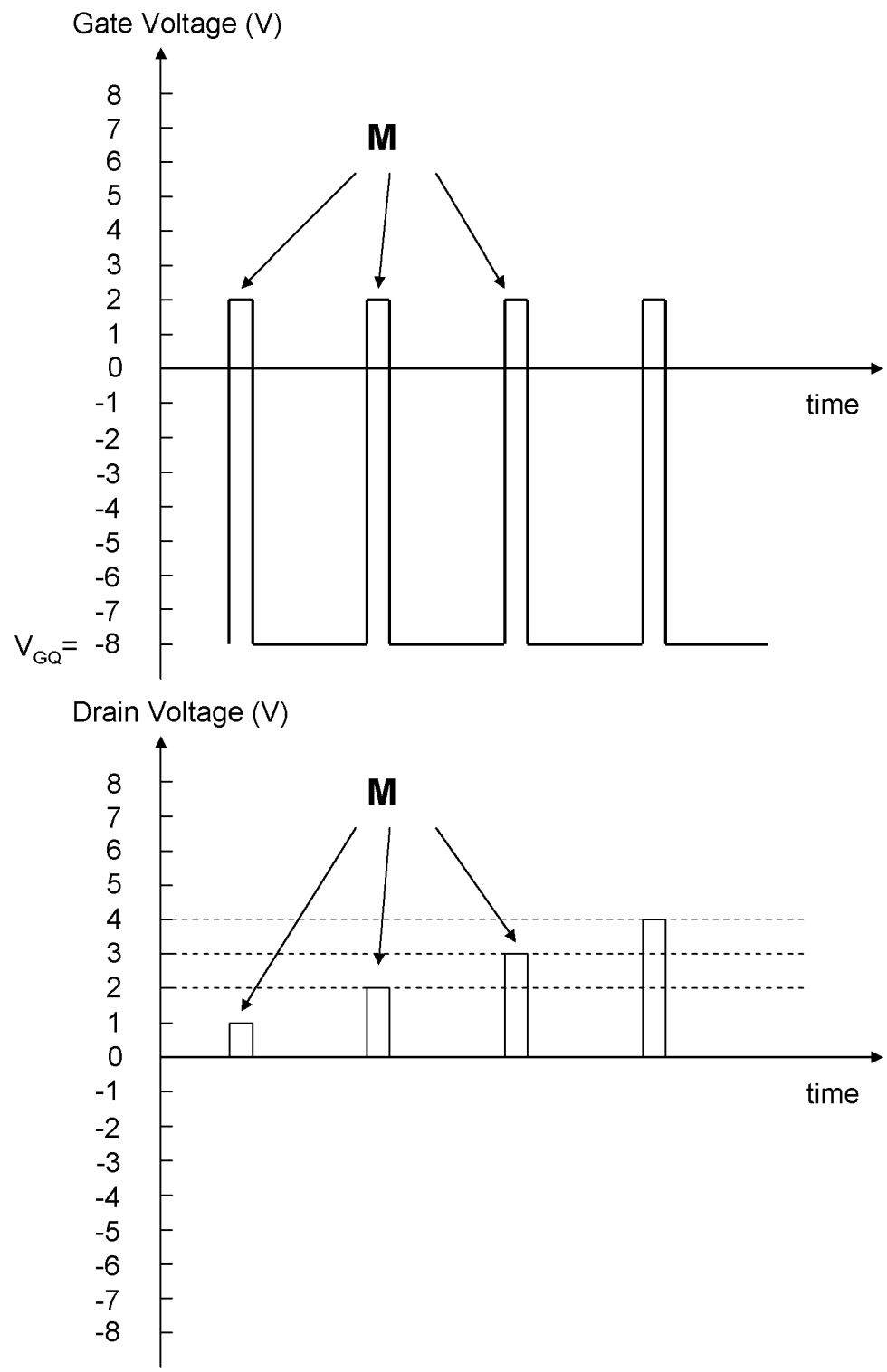
Figure 3:
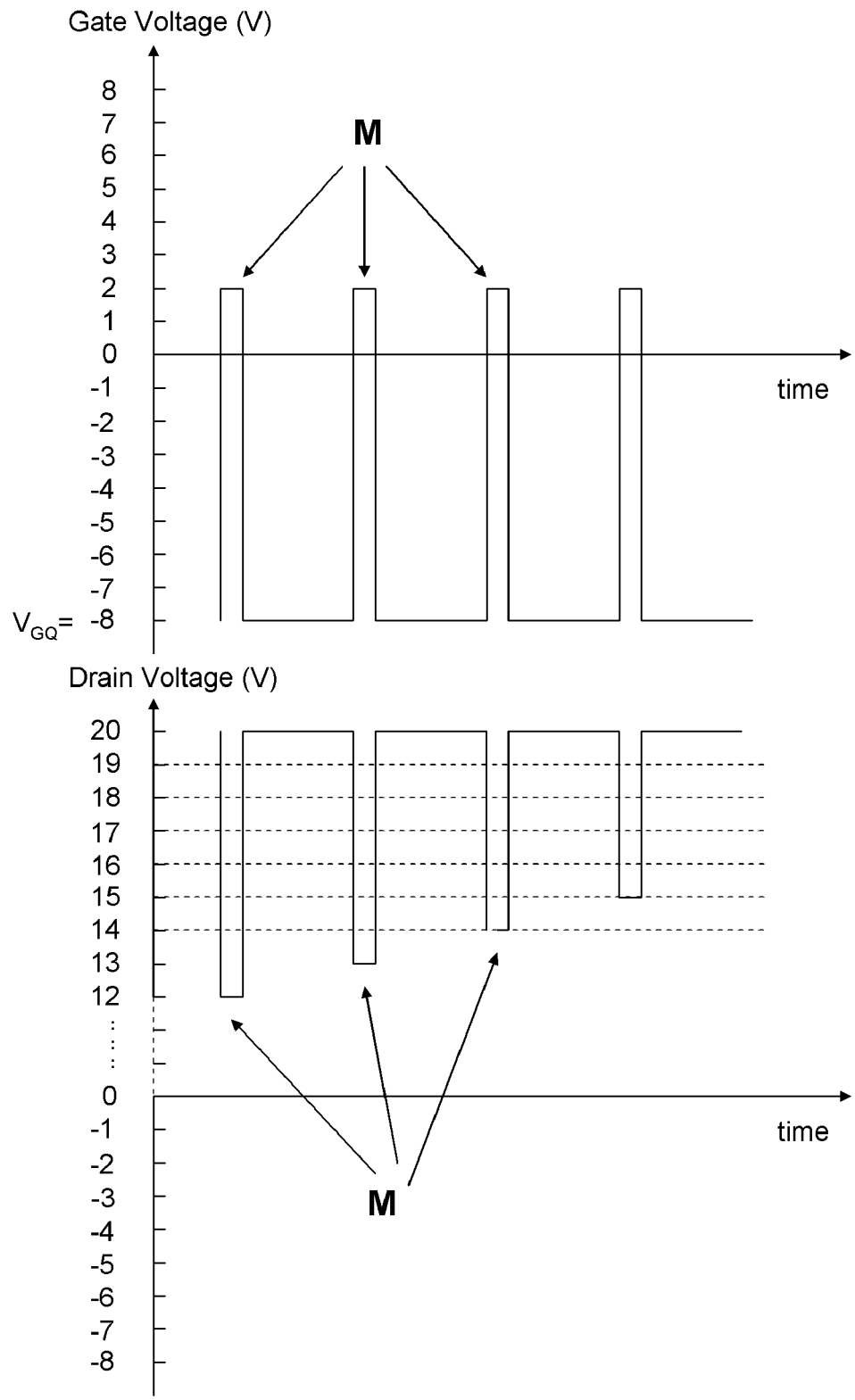

The DC characteristics of the group III-nitride field effect devices or HEMTs were measured by a parameter analyzer unit. The pulsed measurements were performed in a dedicated set-up. The schematic of the pulse-measurement is depicted in FIG. 3. Gate and drain voltages were pulsed together. Measurements of the current between source and drain $I_{ds}$ were done during these pulses, indicated by "M" in FIG. 3. Quiescent bias is defined as the voltage that is applied to the transistor as an initial load prior to each pulse. The gate voltage was switched from two different quiescent biases points, i.e. −8V and 0V, so −8V to 2V or 0V to 2V. The drain voltage was changed from two different quiescent bias points (0V, 15V). Starting from 0V the drain voltage pulses were successively increased in steps of 1V to 15V. The drain current was recorded as a function of the described pulses. During the measurements the source was kept on ground. As a reference the pulsed current ($I_{ref}$) recorded with gate quiescent bias ($V_{gQ}$) and drain quiescent bias ($V_{dSQ}$) 0V and open gate condition ($V_g$) 2V was recorded for all the measurements. The different measurements are represented in FIG. 3. In all measurements the source was kept on ground (0V).

Measurement of the reference is represented in FIG. 3(a). The influence of the drain voltage on the source-drain current $I_{ds}$, is measured while the source was kept on ground (0V), The current between source and drain flowing at a gate voltage of 2V is interrupted on a regular basis by reducing the drain voltage to 0 V. The reason is the following: when a current $I_{ds}$ is flowing continuously between source and drain, there will be heating of the channel resulting in a decrease of $I_{ds}$ during operation. The voltage on the drain is raised in steps of 1V up to 15V and at each step the source-drain $I_{ds}$ current is recorded. The voltage on the drain is applied during 1 μs for each step, in between these pulsed measurements the voltage on the drain is reduced to 0V during 1 ms.

Gate lag measurements are represented in FIG. 3(b). Gate lag measurements were performed at a gate quiescent bias of −8V and a drain quiescent bias of 0V. Subsequently the drain voltage was raised in steps of 1V from 0V to 15V (i.e. 0V to 0V, 0V to 1V, 0V to 2V, . . . ) and the gate voltage was switched between −8V and 2V. At a gate voltage of −8V, the drain voltage was 0V. This step took 1 ms. During these time frames no current $I_{ds}$ was flowing between source and drain. During the actual pulsed measurement the gate voltage was increased to 2V during 1 μs and current $I_{ds}$ could flow between source and drain. At these points an increasing positive drain voltage was applied in steps of 1V up to 15V. At each step the source-drain $I_{ds}$ current was recorded.

Drain lag measurements are represented in FIG. 3(c). Drain lag measurements were performed at a gate quiescent bias of −8V and the drain quiescent bias was kept on 20V. Subsequently the gate voltage was switched between −8V and 2V and the drain voltage was raised in steps of 1V (i.e. 20V to 0V, 20V to 1V, 20V to 2V, . . . ). At a gate voltage of −8V, the drain voltage was 20V. This step took 1 ms. During these time frames no current $I_{ds}$ was flowing between source and drain. In between the gate voltage was increased to 2V during 1 μs and current $I_{ds}$ could flow between source and drain. At these points an increasing positive drain voltage was applied in steps of 1V. At each step the source-drain $I_{ds}$ current was recorded.

The dispersion and gate leakage current were measured using surface cleaning steps prior to the metal and passivation layer deposition. Gate leakage is the current flowing between gate, when put at −8V, and the source at 0V and the drain at 10V. Gate dispersion is the difference between the current during gate lag measurements (FIG. 3(b)) and the current flowing in the reference experiment (FIG. 3(a)). Drain dispersion is the difference between the current during drain lag measurements (FIG. 3(c)) and the current flowing in the reference experiment (FIG. 3(a)).

To avoid variations wafers from the same MOVPE growth run were used for all these experiments.

a. Influence of In-Situ Silicon Nitride Surface Cleaning

On all samples cleaning steps were performed prior to gate and passivation deposition. Cleaning was performed using an undiluted buffered Hydro fluoride Acid (BHF) wet etch solution for 2 min, followed by a water rinse. BHF is defined as 6 parts 40% $NH_4F$ and 1 part 49% HF. Reference samples were processed without cleaning steps.

The gate and the drain lag have been measured after the cleaning treatment and passivation.

The gate dispersion is defined as the value that the current at a drain voltage of 15V is reduced when comparing gate lag measurement with the reference. The drain dispersion is defined as the value that the current at a drain voltage of 15V is reduced when comparing drain lag measurements with the reference. Thus gate dispersion [%] is defined as $(1-I_{gate\_lag}/I_{ref})*100$ and drain dispersion is defined as $(1-I_{drain\_lag}/I_{ref})*100$.

Figure 4:
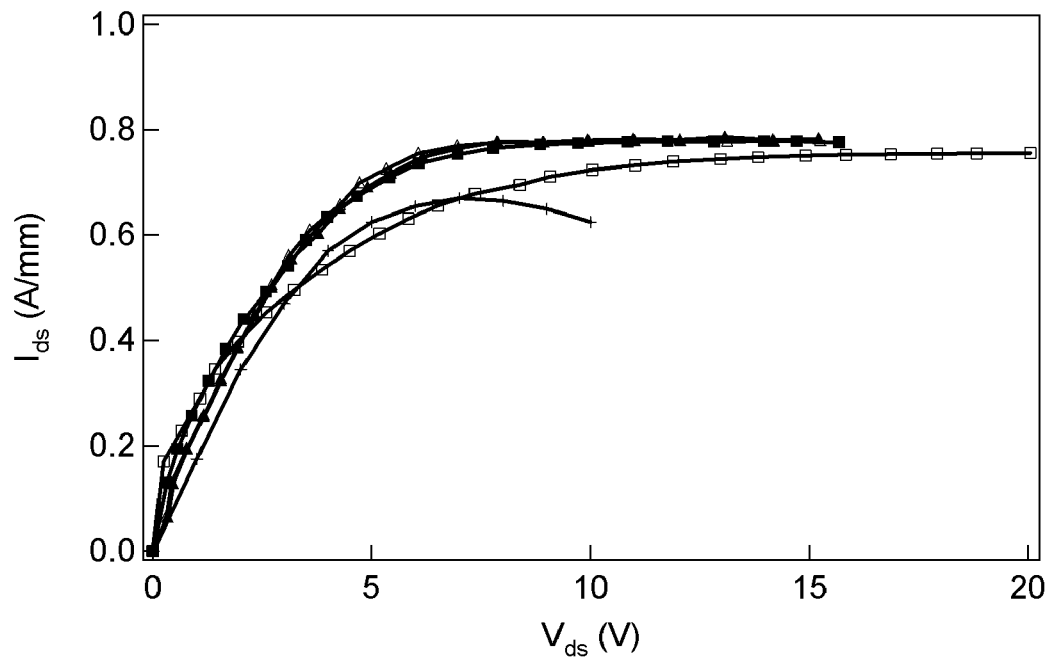
FIG. 4: Dispersion of transistor with sputter deposited silicon oxide as second passivation layer.
Figure 5:
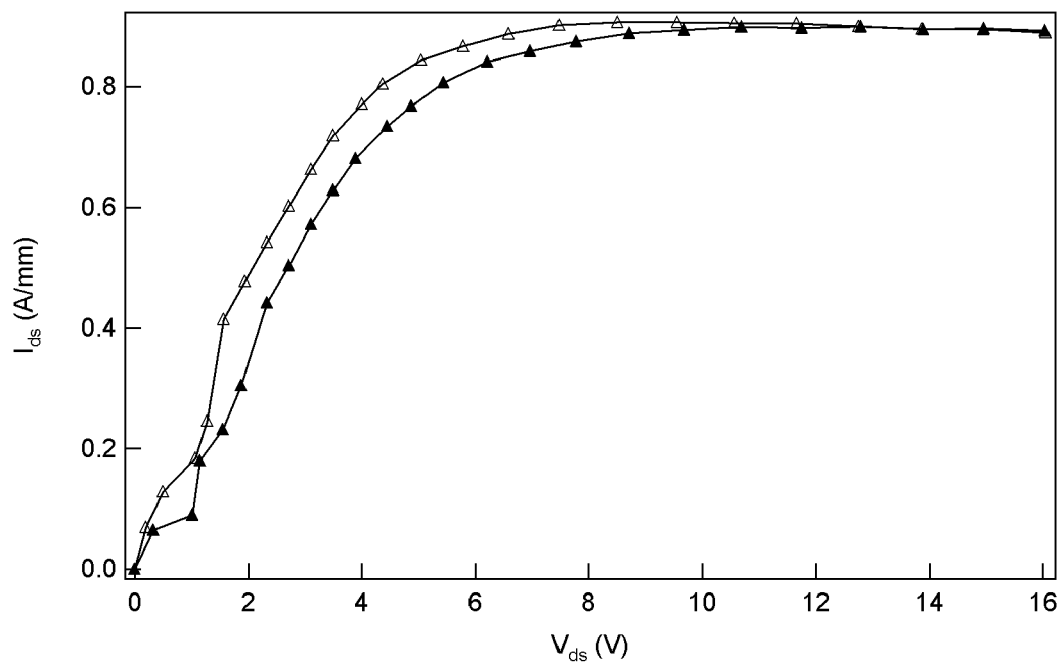
FIG. 5: Gate lag of non-cleaned group III-nitride field effect device with 200 nm sputter deposited $SiO_2$ as second passivation layer.
Figure 6:
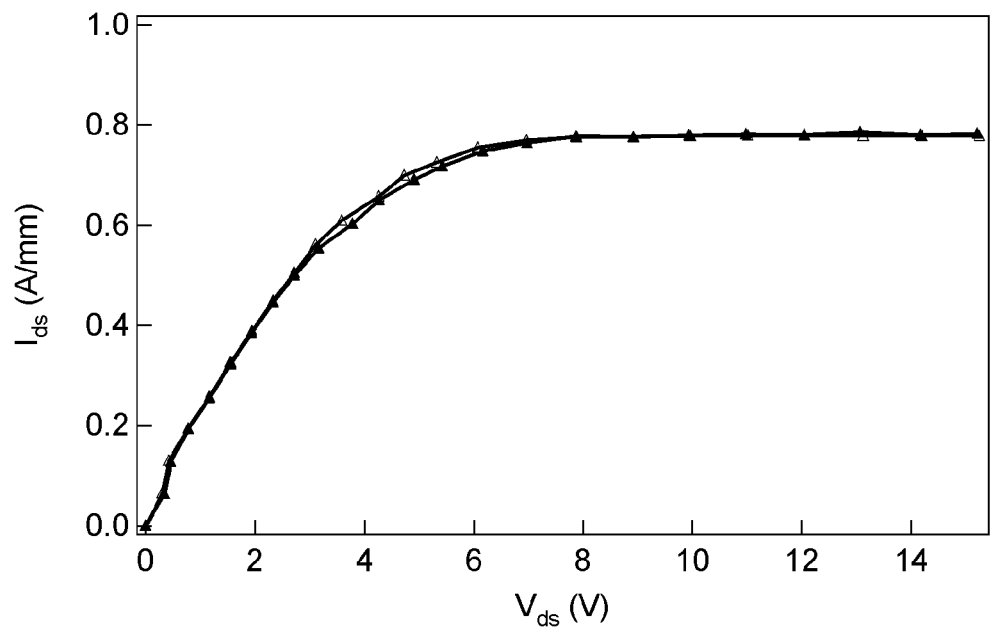
FIG. 6: Gate lag of cleaned group III-nitride field effect device with 200 nm sputter deposited $SiO_2$ as second passivation layer.
Figure 7:
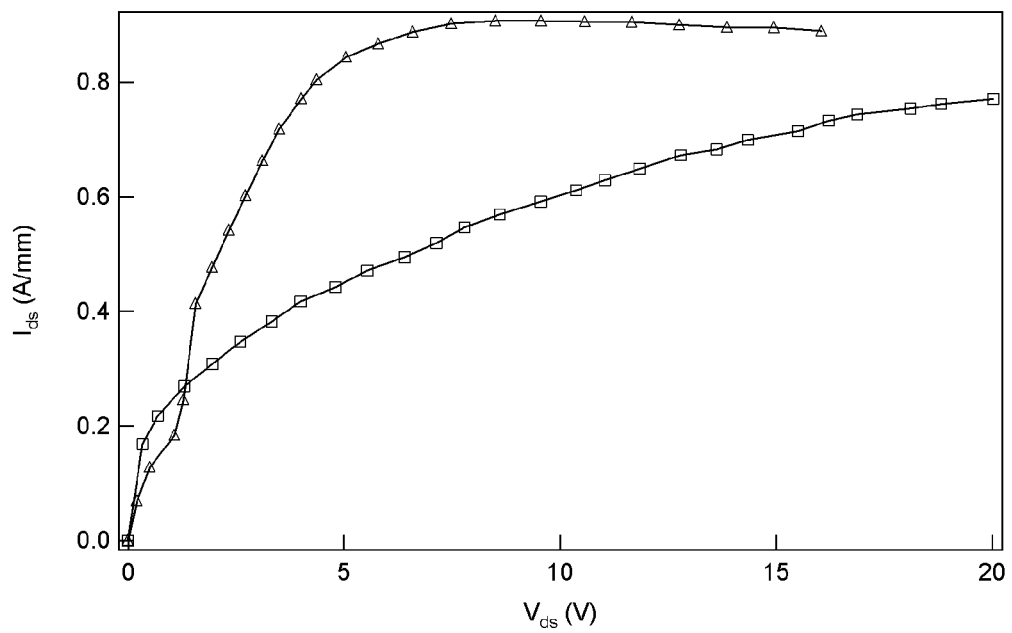
FIG. 7: Drain lag of non-cleaned group III-nitride field effect device with 200 nm sputter deposited $SiO_2$ as second passivation layer.

In FIG. 4 pulsed measurements are shown of the cleaned transistors. The DC measurements are indicated by crosses (+). The gate lag measurements are indicated by filled triangles (▲). The open (□) and filled boxes (■) show the drain lag with a quiescent drain bias of 10V and 20V, respectively. They should be compared to the open triangles (Δ), where the gate is pulsed from 0V to 2V and the drain does not have any quiescent bias (0V).

The transistor shows a low dispersion level. The transistors show low gate dispersion (curves with filled triangles compared to open triangles as a reference) and also drain dispersion (curves with boxes compared to open triangles as a reference).

The open triangles (Δ) in FIGS. 5-8 show the pulsed current behaviour for quiescent bias of 0V at gate and drain. This curve is depicted as a reference. The curves with filled triangles (▲) show the gate lag in FIGS. 5 and 6 and the empty boxes (□) show the drain lag in FIGS. 7 and 8.

The sample without cleans before deposition of gate and passivation (see FIG. 5 the filled triangles for gate dispersion and open triangles as a reference) and the sample with cleans before the deposition of gate and passivation (see FIG. 6 the filled triangles for gate dispersion and open triangles as a reference) only show a slightly different gate dispersion, i.e. a gate dispersion of 1% and 0% respectively. This means that there is no influence of the cleaning for gate lag measurements. In fact also without cleaning, the gate lag measurements are good.

Figure 8:
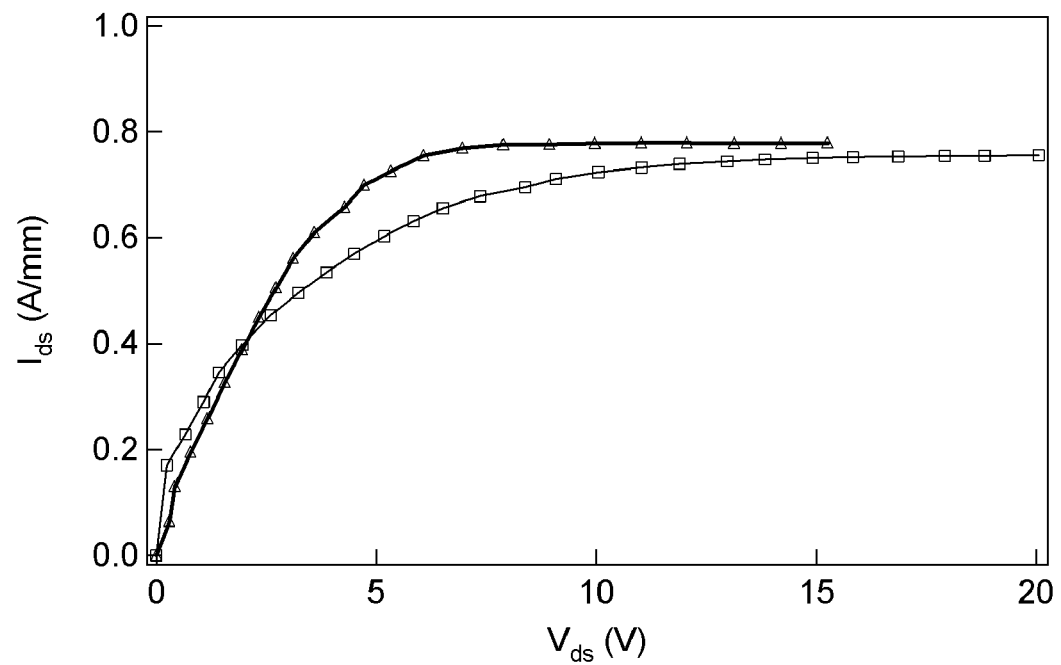
FIG. 8: Drain lag of cleaned group III-nitride field effect device with 200 nm sputter deposited $SiO_2$ as second passivation layer.

The current behaviour changes for the drain dispersion: from 15% for the sample without cleaning steps (see FIG. 7 the open boxes for drain dispersion and open triangles as a reference), it decreases to 3% for the cleaned sample (see FIG. 8 the open boxes for drain dispersion and open triangles as a reference). This indicates that the cleaning step has a beneficial influence on the drain lag.

Figure 9:
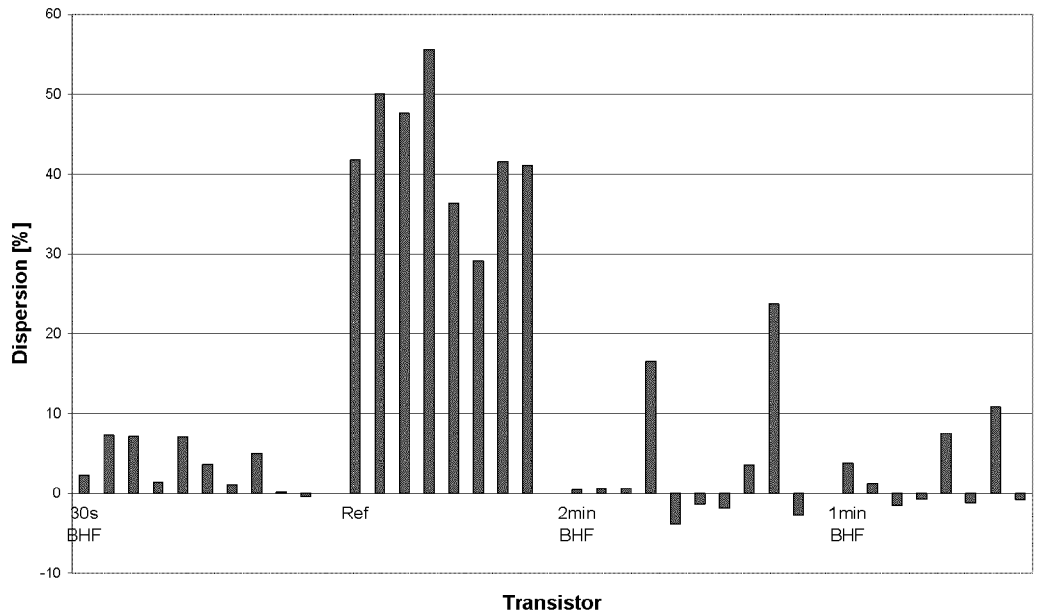
FIG. 9: Drain lag versus cleaning time for a number of randomly chosen transistors.

FIG. 9 depicts the drain dispersion of randomly chosen devices without performing the cleaning procedure and with cleaning during different times (30 sec, 1 min, 2 min). The drain dispersion in transistors on non-cleaned samples is 30%-50%. The drain dispersion in transistors on cleaned samples is often lower than 10%. The improved dispersion after cleaning can be explained by the removal of oxide and contamination of the surface.

b. Gate Leakage Current Decrease

Figure 10:
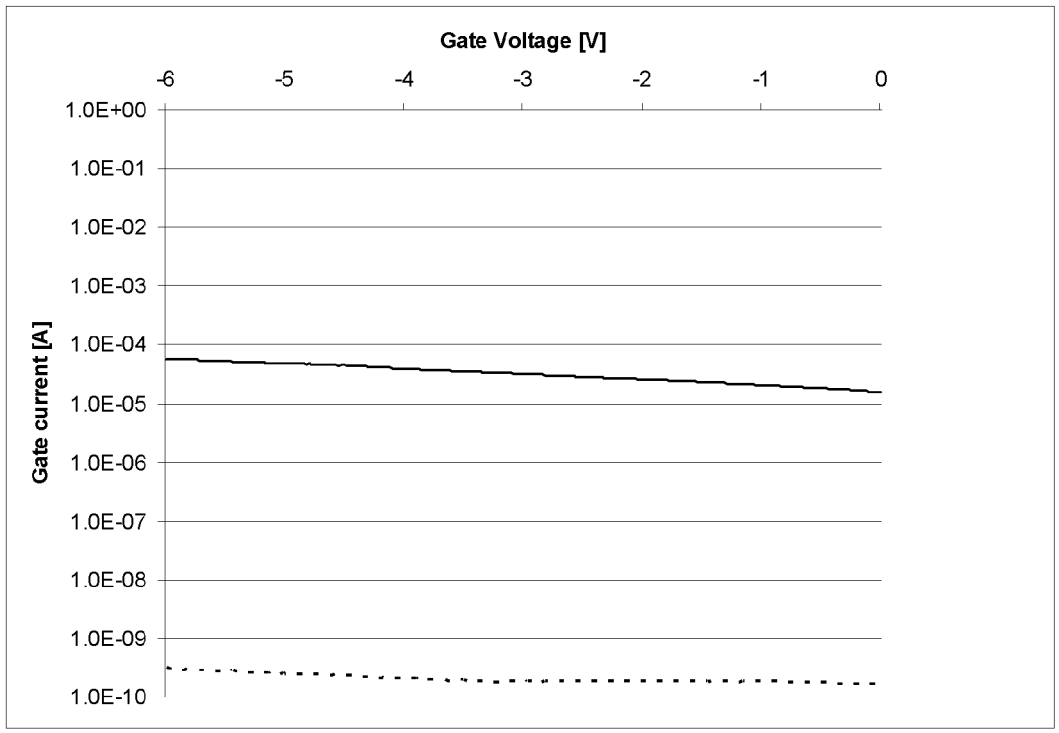
FIG. 10: Reverse Gate Leakage Current versus drain voltage

By using the cleaning procedures before deposition of gate metal and second passivation layer being sputtered silicon oxide, the gate leakage current can be reduced. This can be observed in FIG. 10 showing the reverse gate diode current of a cleaned and non-cleaned device. In the cleaned device both cleaning underneath the gate was done as well as cleaning before the deposition of the second passivation layer. The passivation in both cases is 200 nm sputtered $SiO_2$. For the cleaned device a leakage current decrease of 4 orders of magnitude has been determined from $2 \cdot 10^{-5}$ A to $2 \cdot 10^{-10}$ A at −1V for a device with a gate width of 100 μm. On the average, a leakage current decrease in the order of 2-3 has been measured.

c. Physical Explanation

The dispersion effects may be influenced by the interface between the in-situ silicon nitride (SiN) and the second passivation layer (SiO). XPS measurements showed the presence of $SiO_x$ on the in-situ $Si_3N_4$ surface (see Table 1) on the non-cleaned sample. On the non-cleaned reference sample 0.47 nm of $SiO_x$ was found. The amount of oxide could be reduced by etching in undiluted buffered HF. An etching time of 30 sec is already sufficient to remove the oxide to a level that may be caused by adsorption during transport in air (measured by XPS). The in-situ $Si_3N_4$ thickness is measured as a reference and is in good agreement with the growth parameters. XPS measurements have shown that the oxide on top of the $Si_3N_4$ can be removed by applying this method.

Oxide surface states may be responsible for the effects of dispersion and gate leakage current. By cleaning the silicon nitride before gate deposition and before deposition of a second passivation layer, annihilation of the surface states can be obtained. To minimize dispersion and gate leakage current, both surface cleaning of the in-situ $Si_3N_4$ followed by a second passivation layer, preferably high quality dielectric passivation (i.e. with a low number of pin holes) can be done. The deposition of the second passivation layer immediately after cleaning the silicon nitride prevents re-oxidation of the in-situ $Si_3N_4$.

Example 2

In another experiment a group III-nitride field effect device or HEMT is processed in the standard way up to the definition of gates and first passivation layer. This is done as follows. First (GaN) and second (AlGaN) active layers are deposited, followed by the deposition of the first passivation layer, i.e. $Si_3N_4$. Subsequently a mesa is defined using ICP (inductively coupled plasma) etching, then Ohmic contacts being Ti/Al/Mo/Au are defined on top of the $Si_3N_4$ in a lift-off process and alloyed with SiN using an RTA step and finally an interconnect and contact pad metallization is put on the wafer.

Then the actual cleaning steps take place. Using standard lithography, the gate areas are defined. Just prior to metallization with Mo/Au, there is a twofold cleaning. First the sample is immersed in BHF for a brief duration (1 minute) and rinsed in $H_2O$. Immediately after, the sample is moved into the metallization sputtering tool with a vacuum environment. In a first chamber of the tool, the sample is subjected to a nitrogen plasma for 30 seconds at a power of 20 W. Subsequently, it is moved to a second chamber—without exposing it to atmosphere—where the metallization is sputtered on. The time between the nitrogen plasma and the start of the metallisation is less than 1 minute. Finally, the sample is taken out and excess metal is removed in a lift-off step.

Subsequently a second passivation layer (200 nm $SiO_2$) is deposited. The same cleaning procedure is done before this second passivation. First, the sample is immersed in BHF for 1 minute and rinsed afterwards in water. Then the sample is moved to a deposition tool, where in a first chamber a nitrogen plasma is used, and in a second chamber the 200 nm $SiO_2$ passivation is deposited. The time between the nitrogen plasma and the start of the $SiO_2$ deposition is less than 1 minute. Afterwards, this passivation is etched open to allow access to the contact pads.

These samples are characterized using pulsed measurements as represented in FIG. 3 to assess the presence of traps in the bulk or on the surface of the device. In these measurements, the transistor is kept in a certain bias condition on the gate that allows the trapping states to be charged/discharged. Then using short pulses to apply Vg on the gate and Vds voltages between source and drain, the characteristics of the device are measured. So the current between source and drain $I_{ds}$ is measured as a function of the voltage between source and drain $V_{ss}$. Carefully selecting the bias condition on the gate and by consequence the electric field distribution in the device allows to select which traps are activated.

Figure 11:
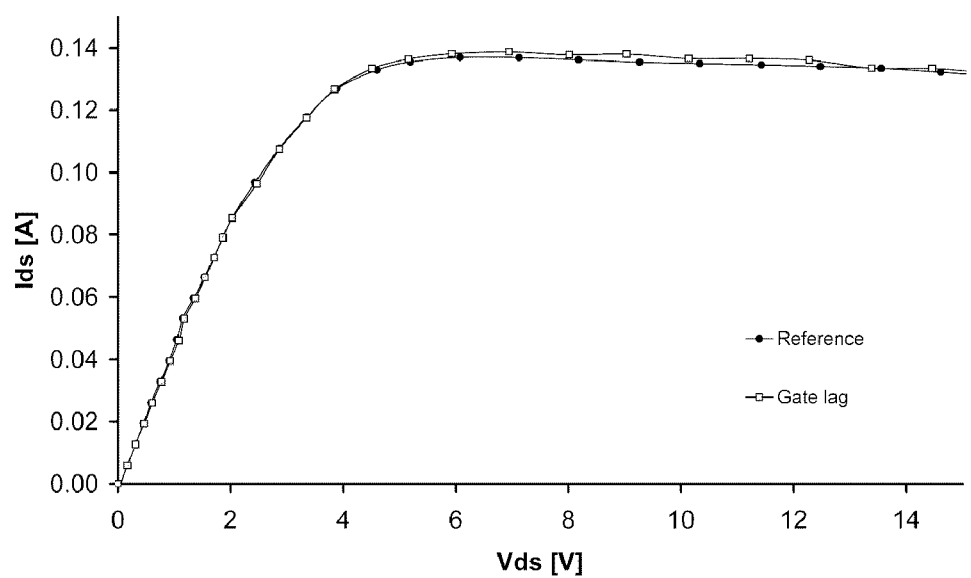
FIG. 11: Measurements for a reference condition compared to the condition especially sensitive to surface traps.

By comparing the measured characteristics one can study the impact and presence of the traps on the device operation. In FIG. 11 the measurements for a reference condition (Vg=0V, Vds=0V without traps activated, filled circles (●)) are compared to the condition especially sensitive to surface traps (Vg=−8V, Vds=0V, open circles (○)) The fact that the two curves match means the surface is perfectly passivated and the interface between the in-situ $Si_3N_4$ on the one hand and the gate and passivation on the other hand is free of trapping states.

TABLE 1

| Sample | $SiO_x$ thickness (nm) | $Si_3N_4$ thickness (nm) |
|---|---|---|
| Q1: 30 s BHF | 0.15 | 2.80 |
| Q2: 1 min BHF | 0.13 | 2.65 |
| Q3: 2 min BHF | 0.10 | 2.89 |
| Ref | 0.47 | 3.71 |

The invention claimed is:

1. A method for making a group III-nitride field effect device comprising:
    placing a substrate in a reaction chamber;
    depositing a first active layer;
    depositing a second active layer having a higher bandgap when compared to said first active layer, thereby forming a two-dimensional electron gas layer at or near an interface between said first active layer and said second active layer;
    depositing on said second active layer a first passivation layer;
    depositing directly on said first passivation layer a source contact;
    depositing directly on said first passivation layer a drain contact;
    performing a first cleaning step on at least a first part of said first passivation layer, said first part of said first passivation layer being a gate cleaning region;
    forming a gate contact on at least part of said gate cleaning region after the first cleaning step;

performing a second cleaning step on at least a second part of said first passivation layer, said at least second part of said first passivation layer being a passivation cleaning region; and depositing a second passivation layer on at least part of said passivation cleaning region after the second cleaning step.

2. The method of claim 1, wherein the group III-nitride field effect device further comprises a two-dimensional electron gas layer at or near the interface between the first and the second active layer underneath said gate contact.

3. The method of claim 1, wherein at least one of said first cleaning step and said second cleaning step is a removal step etching partially in said first passivation layer.

4. The method of claim 3, wherein said removal step etches a maximum of 1 nm of said first passivation layer.

5. The method of claim 1, wherein said first passivation layer comprises at least an electron donating element and nitrogen.

6. The method of claim 5, wherein said first passivation layer comprises silicon nitride deposited in-situ with Metal Organic Chemical Vapor Deposition.

7. The method of claim 5, wherein performing at least one of said first cleaning step and said second cleaning step is done in a solution comprising buffered HF.

8. The method of claim 5, wherein performing at least one of said first cleaning step and said second cleaning step is done by dry etching with gasses comprising at least one gas selected from the group consisting of $SF_6$, $CF_4$, $C_4F_8$, $N_2$, Ar, and combinations thereof.

9. The method of claim 5, wherein performing said second cleaning step is a combination of cleaning in a solution comprising buffered HF and dry etching with gasses comprising at least one gas selected from the group consisting of $SF_6$, $CF_4$, $C_4F_8$, $N_2$, Ar, and combinations thereof.

10. The method of claim 1, wherein said second passivation layer comprises at least one material selected from the group consisting of SiO, SiN, AlO, HfO, and TaO.

11. The method of claim 10, wherein said second passivation layer is sputtered SiO or SiO or SiN deposited with Plasma Enhanced Chemical Vapor Deposition.

12. The method of claim 1, wherein said first active layer and second active layer comprises at least one group III nitride semiconductor material.

13. The method of claim 12, wherein said first active layer comprises GaN and said second active layer comprises at least one material selected from the group consisting of AlGaN and AlGaInN.

14. The method of claim 1, wherein the second passivation layer is a dielectric passivation layer.

15. The method of claim 1, wherein the first passivation layer is a $Si_3N_4$ layer, and wherein performing a first cleaning step removes $SiO_x$ from the first passivation layer to a level, as measured by XPS, characteristic of that caused by adsorption during transport in air.

16. The method of claim 15, wherein deposition of the second passivation layer is conducted immediately after performing a first cleaning step, whereby reoxidation of the first passivation layer is prevented.

17. The method of claim 16, wherein the first active layer is perfectly passivated, wherein an interface between the $Si_3N_4$ layer and the gate is free of trapping states, and wherein an interface between the $Si_3N_4$ layer and the second passivation layer is free of trapping states.

18. The method of claim 1, wherein an interface between the first passivation layer and the gate is free of trapping states, and wherein an interface between the first passivation layer and the second passivation layer is free of trapping states.

19. The method of claim 18, wherein the first active layer is perfectly passivated.

20. The method of claim 19, wherein the second passivation layer is a dielectric passivation layer.

21. A group III-nitride field effect device comprising:
a substrate;
a first active layer on the substrate;
a second active layer on the first active layer, the second active layer having a higher bandgap when compared to said first active layer;
a two-dimensional electron gas layer at or near an interface between said first active layer and said second active layer;
a first passivation layer on the second active layer;
a source contact and a drain contact on the first passivation layer;
at least a first part of said first passivation layer having a cleaned surface and a lower thickness than other parts of the first passivation layer, said first part of said first passivation layer being a gate cleaning region;
at least a second part of said first passivation layer having a cleaned surface and a lower thickness than other parts of the first passivation layer, said second part of said first passivation layer being a passivation cleaning region;
a gate contact on at least part of said gate cleaning region; and
a second passivation layer deposited on at least part of said passivation cleaning region.

22. The device of claim 21, wherein an interface between the first passivation layer and the gate is free of trapping states, and wherein an interface between the first passivation layer and the second passivation layer is free of trapping states.

23. The device of claim 22, wherein the first active layer is perfectly passivated.

24. A method for making a group III-nitride field effect device comprising:
placing a substrate in a reaction chamber;
depositing a first active layer;
depositing a second active layer having a higher bandgap when compared to said first active layer, thereby forming a two-dimensional electron gas layer at or near an interface between said first active layer and said second active layer;
depositing on said second active layer a first passivation layer;
depositing directly on said first passivation layer a source contact;
depositing directly on said first passivation layer a drain contact;
performing a first cleaning step on at least a first part of said first passivation layer, said first part of said first passivation layer being a gate cleaning region;
forming a gate contact on at least art of said gate cleaning region;
depositing a second passivation layer; and
performing a second cleaning step on at least a second part of said first passivation layer, said at least second part of said first passivation layer being a passivation cleaning region, wherein said second passivation layer is deposited on at least part of said passivation cleaning region, wherein performing said first cleaning step and forming said gate contact are done before performing said second cleaning step and depositing said second passivation step.

25. A method for making a group III-nitride field effect device comprising:
- placing a substrate in a reaction chamber;
- depositing a first active layer;
- depositing a second active layer having a higher band gap when compared to said first active layer, thereby forming a two-dimensional electron gas layer at or near an interface between said first active layer and said second active layer;
- depositing on said second active layer a first passivation layer;
- depositing directly on said first passivation layer a source contact;
- depositing directly on said first passivation layer a drain contact;
- performing a first cleaning step on at least a first part of said first passivation layer, said first part of said first passivation layer being a gate cleaning region;
- forming a gate contact on at least part of said gate cleaning region;
- depositing a second passivation layer; and
- performing a second cleaning step on at least a second part of said first passivation layer, said at least second part of said first passivation layer being a passivation cleaning region, wherein said second passivation layer is deposited on at least part of said passivation cleaning region, wherein performing said second cleaning step and depositing said second passivation step are done before performing said first cleaning step and forming said gate contact, said method further comprising etching a hole through said second passivation layer down to said gate cleaning region.

* * * * *